(12) United States Patent
Chen et al.

(10) Patent No.: US 9,105,851 B2
(45) Date of Patent: Aug. 11, 2015

(54) COMPOSITE MATERIAL OF HOLE-BLOCKING POLYMER AND ELECTRON-INJECTION/ELECTRON-TRANSPORT CONJUGATED POLYMER GRAFTED WITH CROWN ETHER INTO WHICH METAL ION IS INTERCALATED, AND USES THEREOF IN OLED AND ORGANIC SOLAR CELL

(75) Inventors: Show-An Chen, Hsinchu (TW);
Hsin-Hung Lu, Kaohsiung (TW);
Yun-Chung Wu, Taipei (TW);
Yun-Sheng Ma, Changshu (CN);
Sih-Hao Liao, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 589 days.

(21) Appl. No.: 13/489,695

(22) Filed: Jun. 6, 2012

(65) Prior Publication Data
US 2013/0140527 A1   Jun. 6, 2013

(30) Foreign Application Priority Data

Dec. 6, 2011   (TW) .............................. 100144912 A

(51) Int. Cl.
| H01B 1/12 | (2006.01) |
| H01L 51/46 | (2006.01) |
| H01L 51/54 | (2006.01) |
| H01L 51/00 | (2006.01) |
| H01L 51/42 | (2006.01) |
| C08L 65/00 | (2006.01) |
| B82Y 10/00 | (2011.01) |
| H01L 51/50 | (2006.01) |
| C08K 5/00 | (2006.01) |
| C08L 71/02 | (2006.01) |

(52) U.S. Cl.
CPC ............ H01L 51/0035 (2013.01); B82Y 10/00 (2013.01); C08L 65/00 (2013.01); H01L 51/0039 (2013.01); H01L 51/4273 (2013.01); C08G 2261/1424 (2013.01); C08G 2261/3142 (2013.01); C08G 2261/3223 (2013.01); C08G 2261/91 (2013.01); C08K 5/0091 (2013.01); C08L 71/02 (2013.01); H01L 51/0036 (2013.01); H01L 51/0037 (2013.01); H01L 51/0049 (2013.01); H01L 51/5072 (2013.01); H01L 51/5096 (2013.01); H01L 2251/308 (2013.01); Y02E 10/549 (2013.01)

(58) Field of Classification Search
None
See application file for complete search history.

(56) References Cited

U.S. PATENT DOCUMENTS

2012/0097938 A1 *  4/2012  Meyer et al. .................... 257/40

FOREIGN PATENT DOCUMENTS

| WO | WO 2009153328 A1 * | 12/2009 | ............. H01L 51/52 |
| WO | WO 2010149261 A1 * | 12/2010 | ............. C08G 61/12 |

OTHER PUBLICATIONS

Lu et al. Supporting Information for J. Am. Chem. Soc. 2011, 133, 9634-9637. Date of publication: Jun. 6, 2011.*
Meng et al. Journal of Polymer Science: Part A: Polymer Chemistry 2009, 47, 2985-2995. Year of publication: 2009.*
Morgado et al. Synthetic Metals 2000, 111-112, 449-452. Year of publication: 2000.*
Hsin-Hung Lu, Yun-Sheng Ma, Neng-Jye Yang, Guan-Hong Lin, Yun-Chung Wu, and Show-An Chen, Creating a Pseudometallic State of K+ by Intercalation into 18-Crown-6 Grafted on Polyfluorene as Electron Injection Layer for High Performance PLEDs with Oxygen- and Moisture-Stable Al Cathode, J. Am. Chem. Soc. 2011, 133, 9634-9637, published on Internet on Jun. 6, 2011.

* cited by examiner

*Primary Examiner* — Andrew K Bohaty
(74) *Attorney, Agent, or Firm* — Bacon & Thomas, PLLC

(57) ABSTRACT

An water/alcohol soluble electron-injection/hole-blocking composite layer contains a conjugated polymer grafted with a side chain crown ether and with pseudo-metallic state of metal-ion stabilized by the crown ether (to reduce electron-injection barrier and facilitate electron transport), and a polymer with hole-blocking function. This composite layer is able to improve the performance of an organic light emitting diode with oxygen- and moisture-stable cathode (such as Al and Au), and the performance of an organic solar cell.

23 Claims, 11 Drawing Sheets

Fig. 3(c)
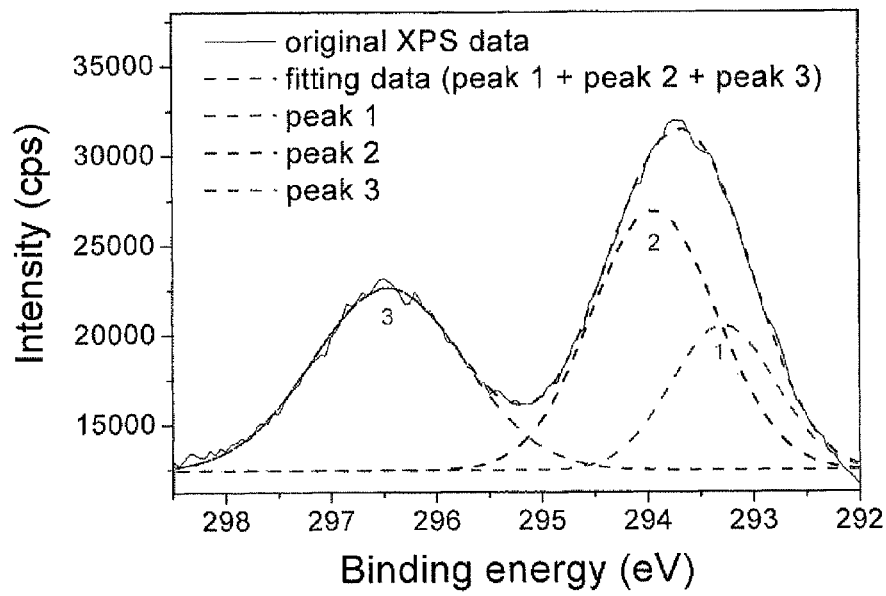
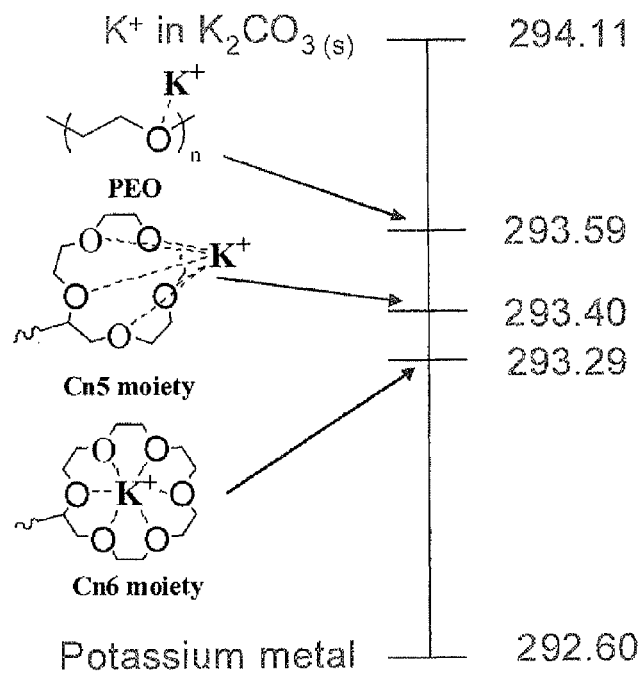
Fig. 4

COMPOSITE MATERIAL OF HOLE-BLOCKING POLYMER AND ELECTRON-INJECTION/ELECTRON-TRANSPORT CONJUGATED POLYMER GRAFTED WITH CROWN ETHER INTO WHICH METAL ION IS INTERCALATED, AND USES THEREOF IN OLED AND ORGANIC SOLAR CELL

FIELD OF THE INVENTION

The present invention is related to a novel water/alcohol soluble composite layer consisting of electron-injection/electron-transport crown ether/metal-ion grafted conjugated polymer and hole-blocking polymer, which can be used to enhance device performance of organic light-emitting diode and organic solar cell with oxygen- and moisture-stable high-work-function metals as the cathode.

BACKGROUND OF THE INVENTION

Polymer light emitting diode (PLED) with a practically acceptable lifetime is an important issue for realization of its industrialization. Therefore, using oxygen- and moisture-stable high-work-function metals as the cathode such as Al, Cu, Ag, and Au has attracted extensive attentions recently. The crucial issue for using the high-work-function metals is the large electron-injection barrier from the metal cathode to emitting layer (EML). Water- or alcohol-soluble electron injection layer (EIL) based on hydroxyl, amino and ammonium-salt groups grafted conjugated polymer has been demonstrated to allow a use of high-work-function metal as the cathodes because the formation of interfacial dipole or space charge between EIL and the cathode can reduce electron-injection barrier (Huang, F., et al., Chem. Mater., 16, 708 (2004). Wu, H. B., et al., Adv. Mater., 16, 1826 (2004). Wu, H., et al., Org. Electron., 6, 118 (2005). Huang, F., et al., Adv. Mater., 19, 2010 (2007). Huang, F., et al., Adv. Mater., 19, 2457 (2009). Oh, S. H., et al., Adv. Mater., 20, 1624 (2008). Yang, R., et al., J. Am. Chem. Soc. 128, 14422 (2006). Seo, J. H., et al., J. Am. Chem. Soc. 130, 10042 (2008)). Consequently, the maximum external quantum efficiency $\eta_{ext}$ (and its corresponding luminous efficiency $\eta_L$) for blue, green, and red emission PLEDs based on fluorescent conjugated polymers and Al as the cathode were reported to reach 1.62% (1.3 cd/A) (Wu, H. B., et al., Adv. Mater., 16, 1826 (2004)), 7.85% (23.8 cd/A) (Wu, H. B., et al., Adv. Mater., 16, 1826 (2004)), and 2.94% (2.89 cd/A) (Huang, F., et al., Adv. Mater., 19, 2457 (2009)), respectively. But, the brightness (and applied voltage) at the $\eta_{ext}$ for the three emissions are only 380 cd/m² (9.7 V), 7,923 cd/m² (8.8 V), and 1,040 cd/m² (9.4 V), respectively, which may cause the extra energy consumption and thus is detrimental to the PLED application. Therefore, enormous efforts must be made on the study of useful water- or alcohol-soluble EIL.

In addition to the hydrophilic groups above, crown ether groups may be expected to serve the same purpose. Polyfluorene grafted with 15-crown-4 moiety (PFC) is used as an EIL for poly(9,9-dihexylfluorene)-based device with Ca as the cathode to reduce turn-on voltage from 6.6 V (without PFC) to 4.1 V (with PFC) and enhance the maximum brightness $B_{max}$ (and $\eta_L$) from 880 cd/m² (0.29 cd/A) to 2,800 cd/m² (0.53 cd/A) due to a formation of interfacial dipole leading to a rise of vacuum level of metal cathode and thus lowering of the electron injection barrier (Yu, J. M., et al., J. Polym. Sci. Part A: Polym. Chem., 47, 2985 (2009)). Crown ethers are a special class of ethers able to form stable complexes with ions of alkali, alkaline earth, and transition metals (Pedersen, C. J., J. Am. Chem. Soc., 89, 2495 (1967). Gokel, G. W., et al., Chem. Rev., 104, 2723 (2004). Pedersen, C. J., Angew. Chem. Int. Ed. Engl., 27, 1021 (1988)). A metal ion with diameter close to the cavity diameter of a crown ether can form a stable complex with it (Pedersen, C. J., Angew. Chem. Int. Ed. Engl., 27, 1021 (1988)). For example, the cavities of 12-crown-4 (1.2-1.5 Å), 15-crown-5 (1.7-2.2 Å) and 18-crown-6 (2.6-3.2 Å) can form stable complexes with lithium ion (1.36 Å), sodium ion (1.94 Å) and potassium ion (2.66 Å), respectively (Pedersen, C. J., Angew. Chem. Int. Ed. Engl., 27, 1021 (1988)). Due to the specific chelating selectivity of crown ether on metal ion, conjugated polymers grafted with various crown ethers on side chain are widely used as a fluorescent sensor for detecting metal ions such as 15-crown-4 grafted hyperbranched (or linear) oligo(fluorene vinylene) for $Ru^{3+}$ and $Fe^{3+}$ ions (Yu, J. M., et al., Macromolecules, 42, 8052 (2009)) or polyfluorene derivatives with benzo-18-crown-6 pendants for $Pb^{2+}$ ion (Yu, M., et al., Macromol. Rapid Commun., 28, 1333 (2007)).

So far two kinds of electron injection layers have been used for the OLEDs, which are an inorganic slat and an organic small molecule matrix doped with an inorganic salts and/or an organic small molecule. Examples of the inorganic salt are vapor deposited Ba-containing compounds such as $BaF_2$ (Cina, S., U.S. Pat. No. 7,833,812 B2 (2010)), and metal oxides such as $LiCoO_2$ and $LiNiO_2$ (Qiu, Y., et al., U.S. Pat. No. 7,501,755 B2 (2009)). One example of the doped organic small molecule matrix is triazine matrix doped with N,N'-di(naphthalene-1-yl)-N,N'-diphenyl-benzidine and $SiO_2$ (SiOc or Sc) (Aziz, H., U.S. Pat. No. 7,111,407 B2 (2010)).

SUMMARY OF THE INVENTION

The present invention discloses a water/alcohol soluble electron-injection/hole-blocking polymeric composite material. The design of the water/alcohol soluble electron injection layer (EIL) is based on the unique characteristic of crown ether able to chelate to metal ions and we demonstrated that it possesses the functions of electron-injection and electron-transport. And further blending another polymer in the EIL for providing hole-blocking function can achieve a high-performance organic light-emitting diode with an oxygen- and moisture-stable high-work-function metal as the cathode. The electron-injection/hole-blocking polymeric composite material of the present invention is also beneficial for enhancing performance of an organic solar cell.

H., et al., Adv. Mater., 20, 1624 (2008); Ref. 4: Yang, R., et al., J. Am. Chem. Soc. 128, 14422 (2006).

FIG. 3. a) XPS spectra (K 2p) of $K_2CO_3$, $PCn6:K^+$ (1:1), and $PCn6:K^+$ (1:3) films. Deconvoluted K 2p signal peaks of b) $PCn6:K^+$ (1:1) and c) $PCn6:K^+$ (1:3) films.

FIG. 4. Plot of K $2p_{3/2}$ binding energy of various $K/K^+$ states.

Figure 5A:
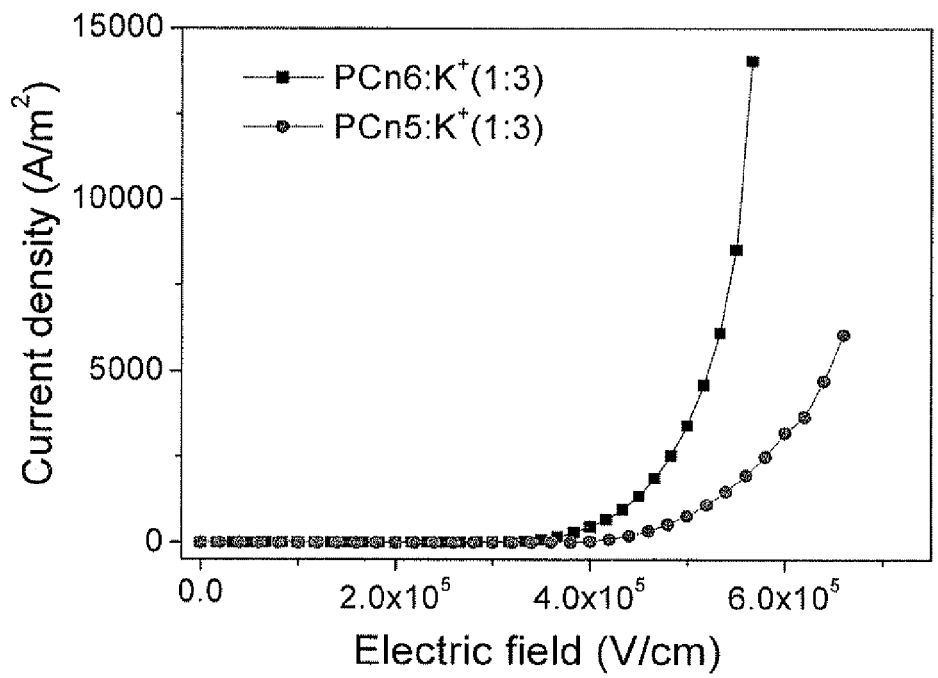
Figure 5B:
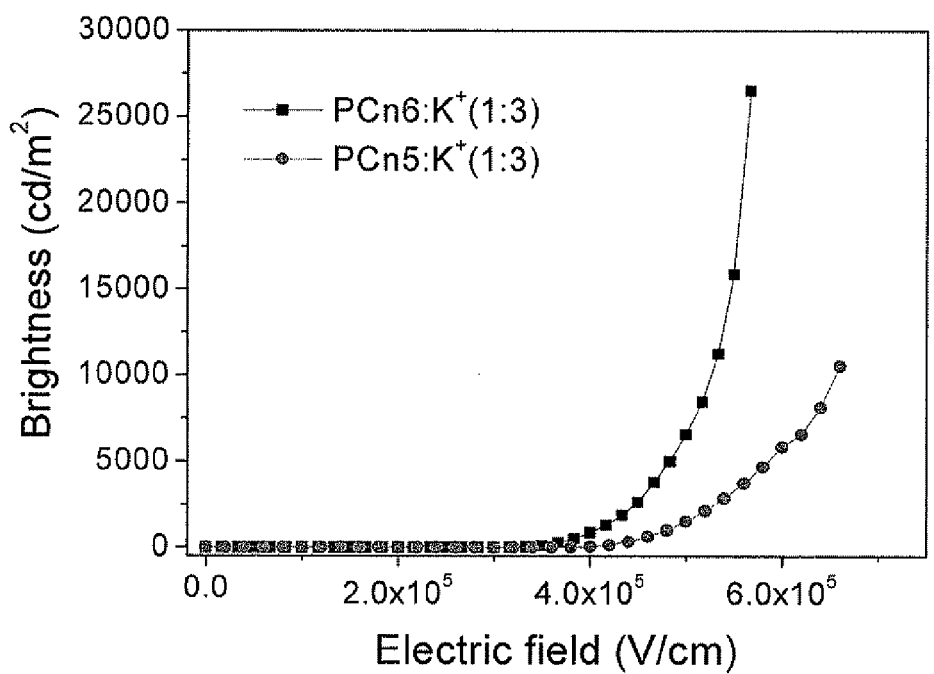
Figure 5C:
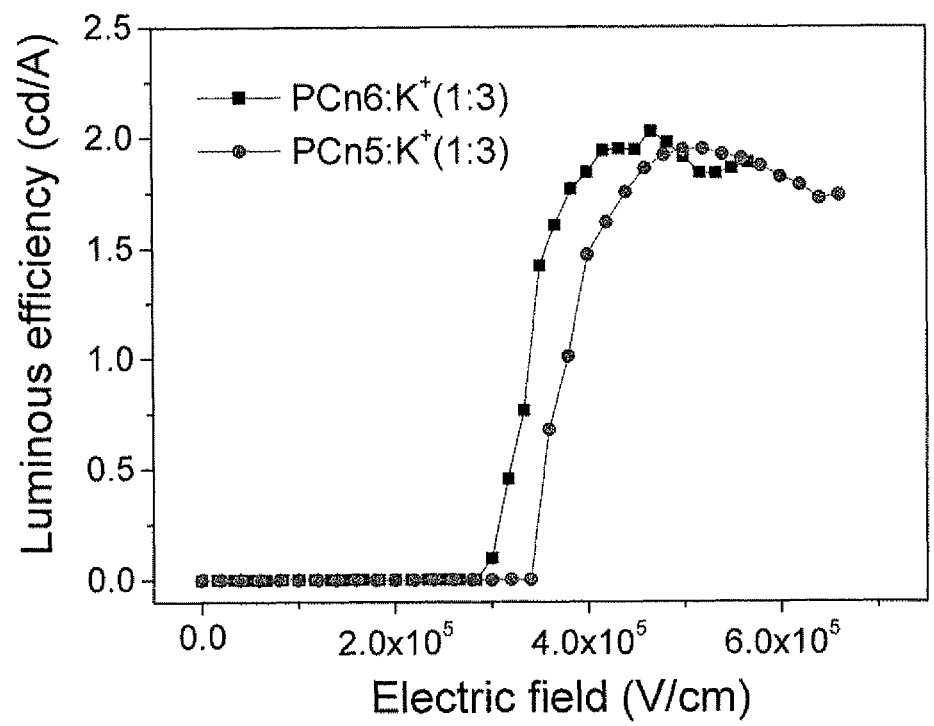

FIG. 5. Characteristic β-PFO-based PLED curves of a) current density, b) brightness and c) luminous efficiency versus electric field for $PCn6:K^+$ (1:3)/Al and $PCn5:K^+$ (1:3)/Al. The device structure is ITO/PEDOT (25 nm)/β-PFO (120 nm for $PCn6:K^+$ (1:3) layer and 100 nm for $PCn5:K^+$ (1:3) layer)/HB-EI layer (20 nm)/Al (60 nm). The data of $PCn6:K^+$ (1:3)/Al are taken from FIG. 2 b-d and shown here for easy comparison.

Figure 6:
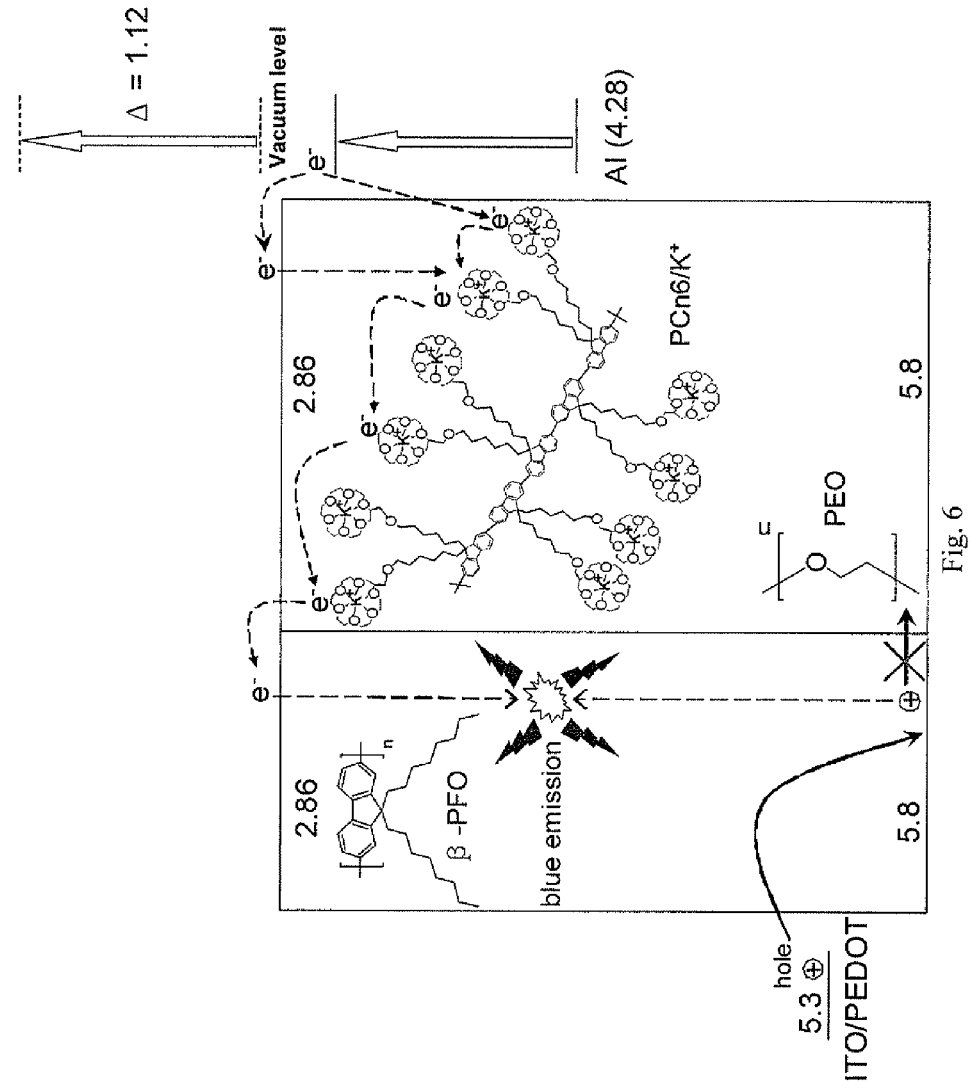

FIG. 6. Schematic illustration of proposed working mechanism. The numbers are referred to the energy levels in eV. Δ means the shift of vacuum level.

Figure 7:
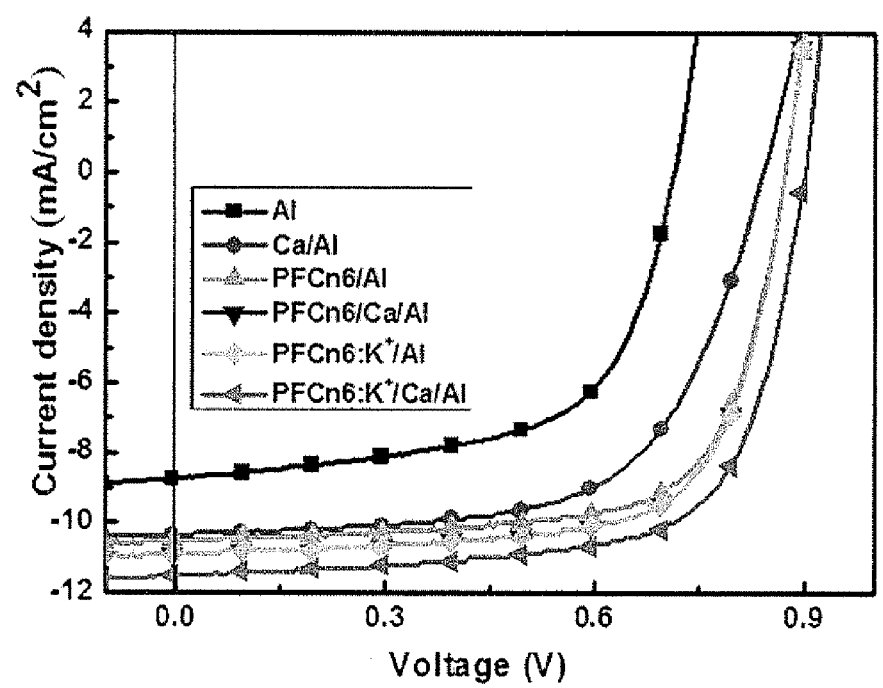

FIG. 7. The performance of PSCs under simulated 100 $mW/cm^2$ AM 1.5 G illumination. Photovoltaic curves of the device: ITO/PEDOT:PSS/P3HT:ICBA/EI-HB or without/Al or Ca/Al.

Figure 8:
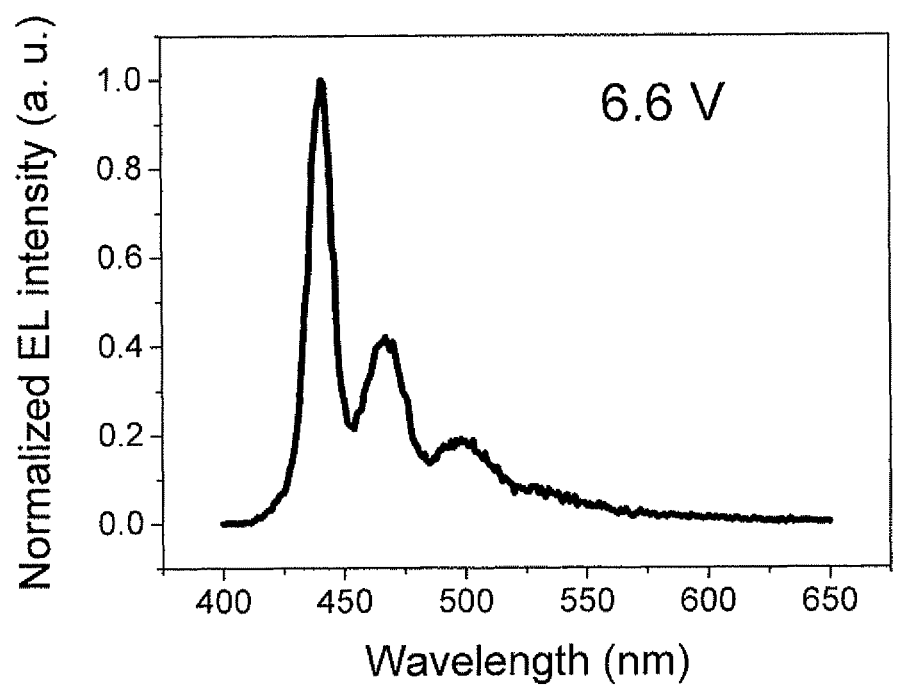

FIG. 8. Electroluminescence (EL) spectrum of PCn6:PEO (1:0.75)/Al (measured at 6.6 V).

DETAILED DESCRIPTION OF THE INVENTION

Preferred embodiments of the present invention include (but not limited to) the following:

1. A composite material comprising a hole-blocking polymer; and a conjugated polymer, wherein said conjugated polymer comprises at least a first repeating unit, said first repeating unit being grafted with a side chain, and said side chain having a crown ether, wherein at least a portion of said crown ethers are intercalated with metal ions.

2. The composite material of Item 1, wherein the crown ether has a structure of —$CHCH_2O(CH_2CH_2O)_q$—, wherein q=2-7.

3. The composite material of Item 1, wherein said conjugated polymer has the following structure (I):

(I)

wherein x and y are molar ratios, 0≤x≤1, 0≤y≤1, and x+y=1; $Ar^I$ and $Ar^{II}$ independently are a repeating unit selected from the group consisting of mono-, bicycle- and polycyclic aromatic groups; heterocyclic aromatic group; substituted aromatic group; and substituted heterocyclic group, wherein one of the $Ar^I$ and $Ar^{II}$ is said first repeating unit. mono-, bicycle- and polycyclic aromatic groups; heterocyclic aromatic group; substituted aromatic group; and substituted heterocyclic group 4. The composite material of Item 1, wherein said first repeating unit has a structure selected from the following group (II):

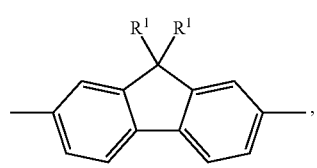
(II)

-continued wherein m=0-4; n=1-4; o=1-2; $R^1$, $R^2$ and $R^3$ independently are crown ethe-methylene-oxy-$C_1$-$C_{22}$ alkylene, crown ether-methylene-oxy-$C_1$-$C_{22}$ alkoxylene, crown ether-methylene-oxy-phenylene, crown ether-methylene-oxy-$C_7$-$C_{28}$ alkylene phenylene, crown ether-methylene-oxy-$C_7$-$C_{28}$ alkoxylene phenylene, crown ether-methylene-oxy-phenoxylene, crown ether-methylene-oxy-$C_7$-$C_{28}$ alkylene phenoxylene, crown ether-methylene-oxy-$C_7$-$C_{28}$ alkoxylene phenoxylene, crown ether-methylene-oxy-biphenylene, crown ether-methylene-oxy-$C_{13}$-$C_{34}$ alkylene biphenylene, crown ether-methylene-oxy-$C_{13}$-$C_{34}$ alkoxylene biphenylene, crown ether-methylene-oxy-biphenylene-oxy, crown ether-methylene-oxy-$C_{13}$-$C_{34}$ alkylene biphenylene-oxy, or crown ether-methylene-oxy-$C_{13}$-$C_{34}$ alkoxylene biphenylene-oxy.

5. The composite material of Item 4, wherein said conjugated polymer is a random copolymer, block copolymer or alternating copolymer.

6. The composite material of Item 4, wherein said conjugated polymer is a homopolymer.

7. The composite material of Item 5, wherein said conjugated polymer is a copolymer having the repeating units selected from the group (II).

8. The composite material of Item 6, wherein said conjugated polymer is a homopolymer having one of the repeating units selected from the group (II).

9. The composite material of Item 8, wherein said conjugated polymer is polyfluorene having the first repeating unit in the group (II).

10. The composite material of Item 1, wherein said conjugated polymer comprises 1~100 mol % of said first repeating unit.

11. The composite material of Item 1, wherein said metal ions are ions of an alkali metal, alkaline earth metal or transition metal.

12. The composite material of Item 1, wherein said metal ions are alkali metal ions.

13. The composite material of Item 1, wherein 1-100 mol % said crown ethers are intercalated with metal ions.

14. The composite material of Item 1, wherein said hole-blocking polymer is a conjugated or non-conjugated polymer having a (large band gap.

15. The composite material of Item 14, wherein said hole-blocking polymer is polyethyleneoxide.

16. The composite material of Item 15, wherein said polyethyleneoxide has a weight averaged molecular weight of 50,000 to 1,000,000 Daltons.

17. The composite material of Item 1, wherein said composite material is soluble in water, alcohol or a mixture thereof.

18. An organic light emitting diode, which comprises a positive electrode formed on a substrate; a negative electrode; and a light emitting layer disposed between said positive electrode and said negative electrode, wherein said organic light emitting diode further comprises a composite material as defined in Item 1 between said light emitting layer and said negative electrode.

19. The organic light emitting diode of Item 18, wherein said negative electrode is aluminum, copper, silver or gold.

20. The organic light emitting diode of Item 18 further comprising a hole injection layer formed between said positive electrode and said light emitting layer.

21. The organic light emitting diode of Item 18 further comprising a hole transporting layer formed between said positive electrode and said light emitting layer.

22. The organic light emitting diode of Item 18, which emits red light, yellow light, green light, blue light, white light or light with broad band containing multiple color peaks.

23. An organic solar cell comprising a positive electrode formed on a substrate; an organic electronic material formed said positive electrode; and a negative electrode formed on said organic electronic material, wherein said organic solar cell further comprises a composite material as defined in Item 1 between said organic electronic material and said negative electrode.

24. The organic solar cell of Item 23, wherein the substrate is a glass substrate, said positive electrode is indium tin oxide (ITO) deposited on the glass substrate, and said negative electrode is a low work function metal.

Figure 1:
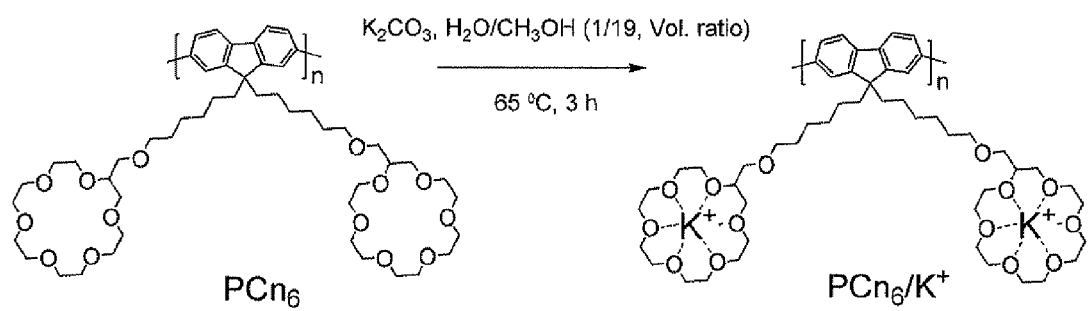
FIG. 1. Reaction condition for the chelation of Cn6 to $K^+$.
Figure 2A:
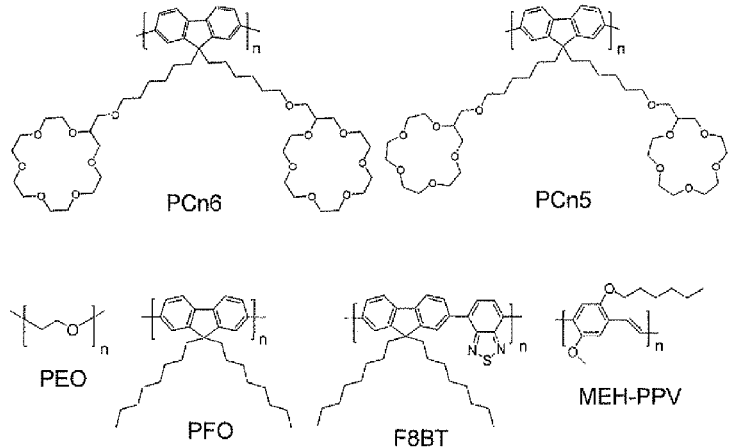
FIG. 2. a) Chemical structures of PCn6, PCn5, PEO, PFO, F8BT, and MEH-PPV. Characteristic curves of b) current density and c) brightness versus voltage and d) luminous efficiency versus current density for β-PFO-based devices without/with EI-HB layers. The device structure is ITO/PEDOT (25 nm)/β-PFO (120 nm)/[with/without EI-HB layers (20 nm)]/Al (60 nm). [ITO=indium tin oxide and PEDOT=poly(styrene sulfonic acid)-doped poly(3,4-ethylenedioxythiophene)] e) Reduced current density ($J/J_{bare\ Al}$) versus open-circuit voltage ($V_{oc}$) difference (relative to $V_{oc,\ bare\ Al}$) for PCn6:$K^+$ (1:x), PCn5:$K^+$ (1:x) and from the references (here the subscript "bare Al" is referred to the device only with Al as the cathode and without EI-HB layer). The value in the parenthesis indicates the electric field at which the current density is taken. The references are taken from Ref. 1: Wu, H. B., et al., Adv. Mater., 16, 1826 (2004); Ref. 2: Huang, F., et al., Adv. Mater., 19, 2010 (2007); Ref. 3: Oh, S.

In the present invention, we provide a water/alcohol soluble electron-injection/hole-blocking (EI-HB) composite layer comprising pseudo-metallic state of metal-ion stabilized by crown ether (to reduce electron-injection barrier and facilitate electron transport) and a polymer (to provide hole-blocking function) for achieving high-performance organic light-emitting diode with oxygen- and moisture-stable cathode (such as Al and Au). In one of the preferred embodiments of the present invention, a water- or alcohol-soluble EIL based on 18-crown-6 (Cn6) grafted polyfluorene (PCn6) blended with $K_2CO_3$ (to supply $K^+$) was used. Cn6 provides a solubility in highly polar solvent (water or alcohol) and thus can prevent a dissolution of the emitting layer (EML) while applying a thin EIL atop it. As shown in FIG. 1, Cn6 can chelate to $K^+$, and the chelated $K^+$ acts like potassium metal (and is termed pseudo-metallic state here) for reducing electron-injection barrier and facilitating electron transport, thus allowing a use of high-work-function stable metal (Al or Au) as the cathode for β-phase-containing poly(9,9-di-n-octylfluorene) (β-PFO)-based device. Further blending polyethyleneoxide (PEO) into $K_2CO_3$-blended-PCn6 layer (at the Cn6:$K^+$ mole ratio 1:3) to provide HB functionality can remarkably enhance device performance to reach the highest record of deep-blue PLED based on conjugated polymer as EML among the academic reports, which are maximum brightness 54,800 cd/m$^2$ and an external quantum efficiency (and current efficiency) of 5.42% (6.14 cd/A) and are even much higher than that using CsF/Al as the cathode (34,326 cd/m$^2$, 3.33%, and 3.85 cd/A). Moreover, the EI-HB layers can enhance the power conversion efficiency of β-PFO-based solar cell by a factor of 3.5. Chemical structures of PCn6, 15-crown-5 (Cn5) grafted polyfluorene (PCn5), PFO, PEO, poly(9,9-dioctylfuorene-alt-benzothiadiazole) (F8BT) and poly(2-methoxy-5-(2-ethylhexyloxy)-1,4-phenylene vinylene) (MEH-PPV) are shown in FIG. 2(a).

In the following examples, we demonstrated a water/alcohol soluble EIL based on PCn6 blended with $K_2CO_3$. Cn6 provides a solubility in highly polar solvent (water or alcohol) and thus can prevent a dissolution of the EML while applying a thin EIL atop it. In addition, Cn6 can chelate to $K^+$ to allow it acting like potassium metal (and is termed pseudo-metallic state here) for reducing electron-injection barrier and facilitating electron transport, thus allowing a use of high-work-function stable metal (Al or Au) as the cathode for β-PFO-based device. Further blending PEO into $K_2CO_3$-blended-PCn6 layer (at the mole ratio 1:3 of Cn6:$K^+$) to provide HB functionality can remarkably enhance device performance to reach the highest record of deep-blue PLED based on conjugated polymer as EML among the academic reports, which are maximum brightness 54,800 cd/m$^2$ and an external quantum efficiency (and current efficiency) of 5.42% (6.14 cd/A) and are even much higher than that using CsF/Al as the cathode (34,326 cd/m$^2$, 3.33%, and 3.85 cd/A). In addition, device performance of green- and orange-emission PLEDs (PFO:F8BT (1:0.05 wt. ratio) and MEH-PPV as EMLs, respectively) can also be enhanced by a factor larger than 100 when EI-HB layer is inserted between EML and Al cathode. Moreover, the EI-HB layers can enhance the power conversion efficiency of β-PFO-based solar cell by a factor of 3.5.

We first define the notations for these EI-HB layers used in this invention. PCn6:$K^+$ (1:x) layer represents that the layer is composed of PCn6 and $K_2CO_3$, and x in the parenthesis (0, 1, or 3) stands for the mole ratio of $K^+$ relative to Cn6. PCn6:PEO(1:y) layer represents that the layer is composed of PCn6, $K_2CO_3$ and PEO at the mole ratio of $K^+$ relative to Cn6 keeping at 3:1, and y in parenthesis (0.75, 1, 1.5 and 2) stands for the weight ratio of PEO relative to PCn6. And, PCn6:$K^+$ (1:x)/Al (or PCn6:PEO(1:y)/Al) and PCn6:$K^+$ (1:x)/Au (or PCn6:PEO(1:y)/Au) are corresponding β-PFO-based devices with Al and Au as the cathode, respectively. Also, this notation system is also applied to the case of PCn5 blended with $K_2CO_3$ or with both $K_2CO_3$ and PEO. In addition, PEO:$K^+$ (6:3) layer represents that the layer contains PEO and $K_2CO_3$ at a PEO (repeat unit):$K^+$ mole ratio of 6:3.

Figure 2B:
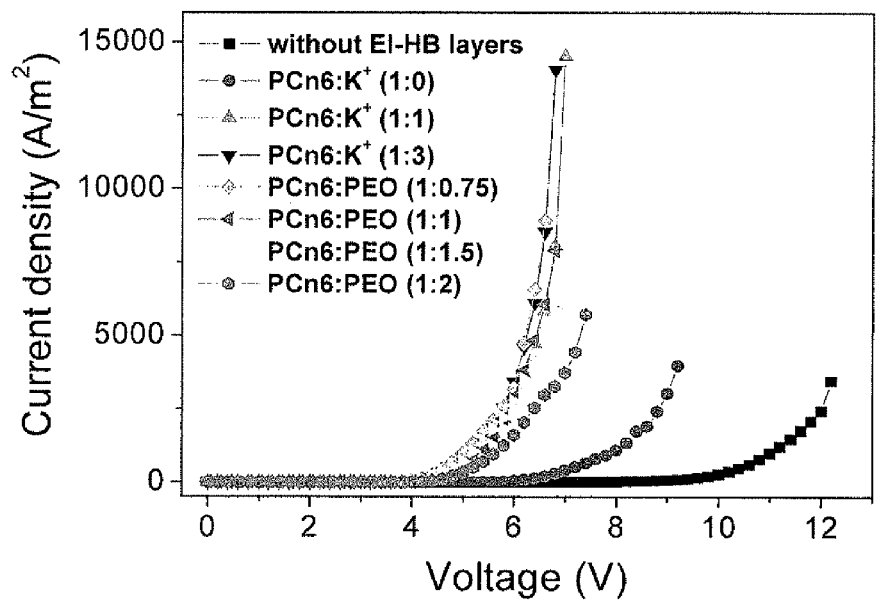
Figure 2C:
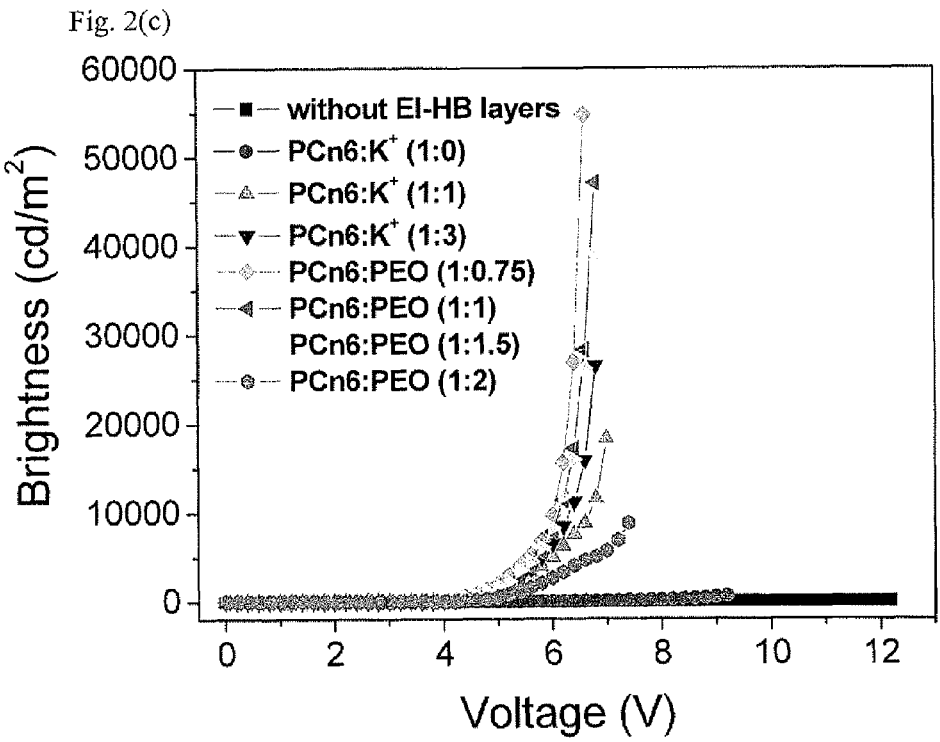
Figure 2D:
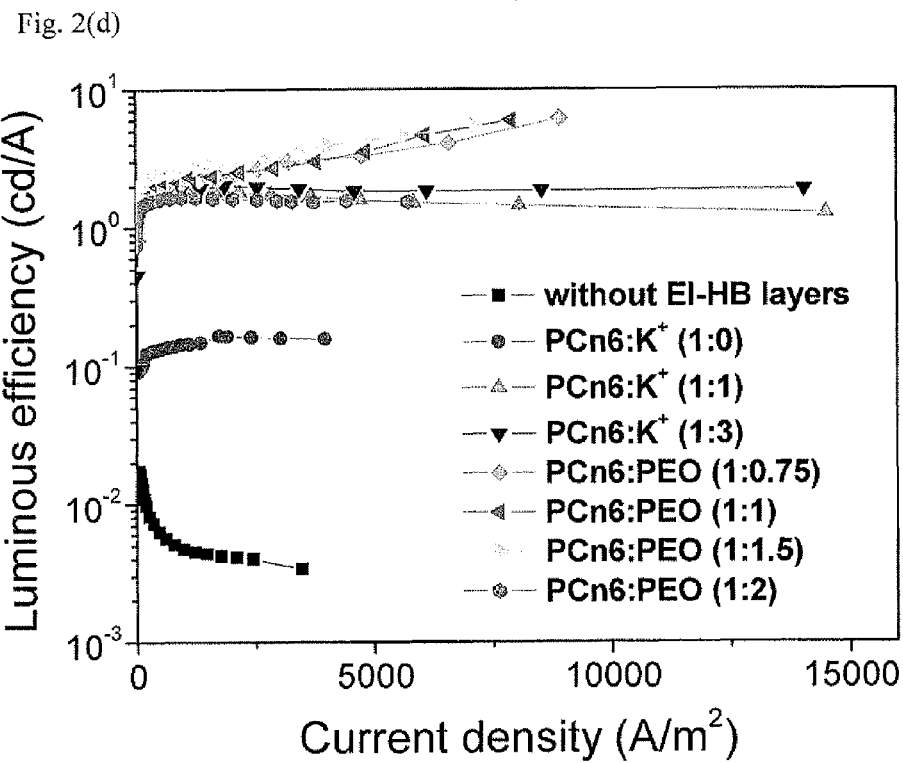

The characteristic curves of current density (J)-brightness versus voltage and luminous efficiency versus current density for β-PFO-based devices without/with EI-HB layers are shown in FIG. 2(b)-(d) (also see Table 1 for their characteristic performance values). The current density profile of PCn6:$K^+$ (1:0)/Al increases significantly in comparison with that of the device without this layer. When $K_2CO_3$ is blended into PCn6 with a Cn6:$K^+$ mole ratio of 1:1 or 1:3, the corresponding device exhibits remarkably higher current density profile as compared to that from PCn6:$K^+$ (1:0)/Al. For example, the current density of PCn6:$K^+$ (1:3)/Al at 6 V is larger than that of PCn6:$K^+$ (1:1)/Al, PCn6:$K^+$ (1:0)/Al, and the device without EI-HB layer by a factor of 1.2, 74, and 1700, respectively. Similarly, the profile of brightness follows the same trend, and PCn6:$K^+$ (1:3)/Al gives $B_{max}$ 26,500 cd/m$^2$, which is dramatically higher than that from the device without EI-HB layer (12 cd/m$^2$). In addition, turn-on voltage drops dramatically from 10 V (no EI-HB layer) to 5.8 V (PCn6:$K^+$ (1:0)/Al) and then to 3.6 V (PCn6:$K^+$ (1:1 or 1:3)/Al). Also, PCn6:$K^+$ (1:x)/Al exhibits much higher $\eta_L$ than that of the device without this layer, and reaches the highest one (2.03 cd/A) at the ratio Cn6:$K^+$ (1:3). Apparently, device performance with Al as the cathode can be remarkably enhanced while the water/methanol soluble PCn6:$K^+$ is inserted as EIL. Because no change is made on the ITO/

PEDOT anode, the enhanced device performance can be attributed to the increased electron current density resulted from the reduction of electron-injection barrier provided by Cn6:K⁺ (1:x) layers due to the formation of interfacial dipole.

Figure 2E:
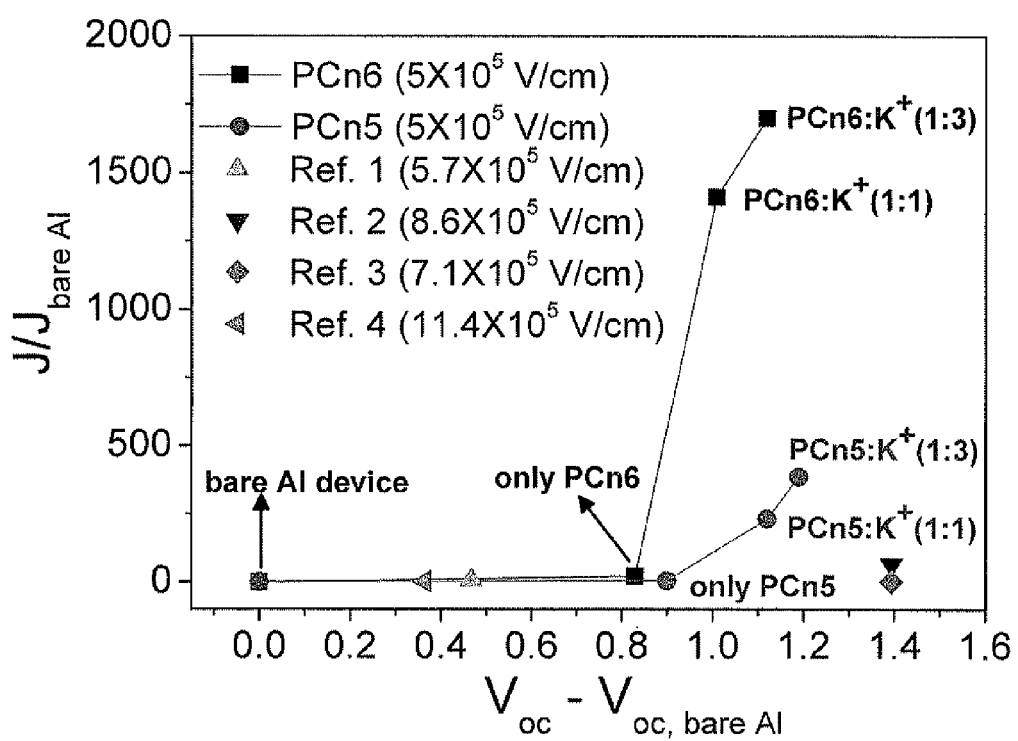

In order to demonstrate that the chelated K⁺ plays another role in barrier reduction, we plot the reduced current density ($J/J_{bare\ Al}$, here the subscript "bare Al" is referred to the device only with Al as the cathode and without EI-HB layer) versus $V_{oc}$-$V_{oc,\ bare\ Al}$. As shown in FIG. 2e, $J/J_{bare\ Al}$ dramatically increases from 23 (with only PCn6) to 1411 (PCn6:K⁺ (1:1)). But, their corresponding $V_{oc}$ differences (relative to $V_{oc,\ bare\ Al}$) increase only from 0.83 V to 1.01 V. Obviously, the added K⁺ plays another role in barrier reduction in addition to the formation of interfacial dipole because it causes an increase of $J/J_{bare\ Al}$ larger than that expected from the increase of $V_{oc}$ difference. The additional function is attributed to that K⁺ chelated by Cn6 forms a "pseudo-metallic state" of K⁺ (as will be revealed by XPS data below) to provide an intermediate step beneficial for electron injection from the cathode to EIL. The dramatic increase of $J/J_{bare\ Al}$ also happens to the case of PCn5:K⁺ (1:x)/Al but in a less extent, indicating that the inference of the pseudo-metallic state enhancing electron injection is reasonable. In addition, the $J/J_{bare\ Al}$ of PCn6:K⁺ (1:3)/Al (1700) is larger than those without K⁺ intercalation calculated from the literature data (Wu, H. B., et al., Adv. Mater., 16, 1826 (2004). Huang, F., et al., Adv. Mater., 19, 2010 (2007). Oh, S. H., et al., Adv. Mater., 20, 1624 (2008). Yang, R., et al., J. Am. Chem. Soc. 128, 14422 (2006)), indicating the extraordinary effect of the pseudo-metallic state on the enhancement of electron injection.

TABLE 1

Performance characteristics of β-PFO-based devices with/without EI-HB layers. The device structure is ITO/PEDOT (25 nm)/β-PFO (120 nm)/[with/without EI-HB layers (20 nm)]/Al (60 nm).

|  | Turn-on voltage[a] (V) | Max. brightness (cd/m²) | Max. luminous efficiency (cd/A) |
|---|---|---|---|
| Without EI-HB layers | 10 | 12 | 0.017 |
| PCn6:K⁺(1:0) | 5.8 | 624 | 0.17 |
| PCn6:K⁺(1:1) | 3.6 | 18,300 | 1.88 |
| PCn6:K⁺(1:3) | 3.6 | 26,500 | 2.03 |
| PCn6:PEO(1:0.75) | 3.4 | 54,800 | 6.14 |
| PCn6:PEO(1:1) | 3.8 | 47,100 | 5.95 |
| PCn6:PEO(1:1.5) | 3.4 | 38,800 | 5.45 |
| PCn6:PEO(1:2) | 3.8 | 8,900 | 1.65 |

[a]Brightness at 2 cd/m².

For further effective utilization of injected holes from the anode, PEO is incorporated into the EIL by blending to serve as hole-blocking function. At the weight ratio of PCn6:PEO 1:0.75, the device performance of PCn6:K⁺ (1:3)/Al can be further enhanced to $B_{max}$ 54,800 cd/m² and $\eta_L$ 6.14 cd/A ($\eta_{ext}$ 5.42%), which is the highest record among deep-blue PLEDs based on conjugated polymer as the EML. Further increasing PEO content can lead to a decrease in device performance. For PCn6:PEO(1:2)/Al, its $B_{max}$ and $\eta_L$ drop to 8,900 cd/m² and 1.65 cd/A, respectively, resulting from that too much holes were blocked as indicated by its lower current density than that of PCn6:K⁺ (1:3)/Al (for example, by a factor of 2.1 at 6 V).

Figure 3A:
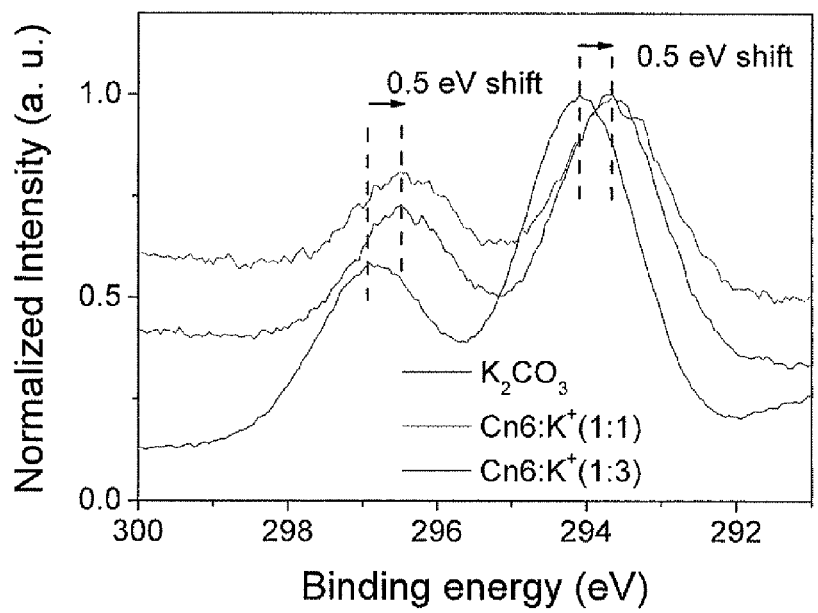

We performed XPS measurements on PCn6:K⁺ (1:1 and 1:3) films to investigate the interaction between Cn6 and K⁺ in the Cn6/K⁺ complex. As shown in FIG. 3(a), the characteristic electron binding energies of K $2p_{3/2}$ and K $2p_{1/2}$ of $K_2CO_3$ are 294.11 and 296.91 eV, respectively. In the Cn6/K⁺ complex, these two binding energies shift by 0.5 eV to the lower values 293.61 and 296.41 eV, respectively. This indicates that K⁺ receives extra electrons from the oxygen atoms in Cn6, leading to its electron states (K $2p_{3/2}$ and K $2p_{1/2}$) shifting toward those of potassium metal (K $2p_{3/2}$ 292.60 eV and K $2p_{1/2}$ 295.50 eV) (Schulze, M., et al., Fresenius J. Anal. Chem., 365, 178 (1999)). For the case of dibenzo-18-crown-6/K⁺ complex, the two K 2p binding energies have been found to be independent of the counter ions (Cl⁻, Br⁻, and I⁻), implying that the electron donation from lone-pair electron on oxygen atom can effectively stabilize the K⁺ (Bohman, O., et al., Phys. Scripta, 16, 355 (1977)). This new state of K⁺ is thus termed as "pseudo-metallic state" and is expected to provide a bridge for electron transport between high work function metal Al and EML.

Figure 3B:
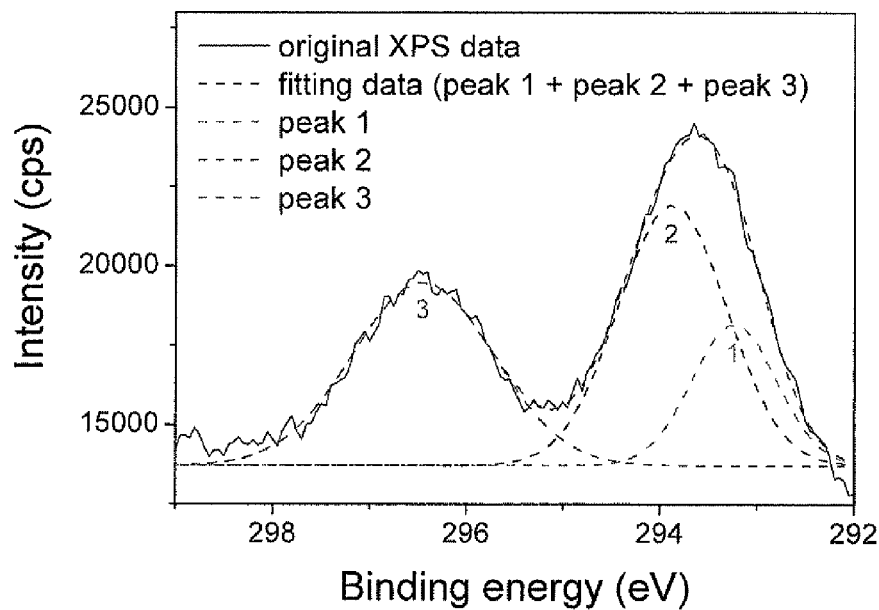

From these XPS results, the fractions of Cn6 chelating to K⁺ can be determined by deconvoluting their K $2p_{3/2}$ signal peaks (FIGS. 3(b) and 3(c)) to be 39.5% and 94.7% for PCn6:K⁺ (1:1) and PCn6:K⁺ (1:3) films, respectively. The latter is higher than the former by a factor of 2.4, accounting for the observed larger $V_{oc}$ value (2.36 V) and thus larger current density (for example, 3432 A/m² at 6 V, FIG. 2(b)) for PCn6:K⁺ (1:3)/Al than PCn6:K⁺ (1:1)/Al ($V_{oc}$ value 2.25 V and current density 2849 A/m² at 6 V).

We find that facilitating electron transport in these EILs is also important for increasing electron current density and the stronger interaction between K⁺ and crown ether (i.e., Cn6/K⁺) can form more K⁺ channels across the EIL for electron transport. FIG. 4(a) illustrates K $2p_{3/2}$ binding energies of various K/K⁺ states and one can know that the interaction between Cn6 and K⁺ is stronger than Cn5/K⁺ and PEO/K⁺ because its binding energy is closer to potassium metal than the others. This also explains why the performance of the device with PCn6:K⁺ as EIL is better than that with PCn5:K⁺ as EIL (FIGS. 5(a), 5(b) and 5(c)).

Therefore, we propose the working mechanism of the EI-HB layer as illustrated in FIG. 6. The chelated K⁺ can further reduce electron-injection barrier due to the formation of interfacial dipole (for example, the barrier can be reduced by 1.12 eV for the case of inserting PCn6:K⁺ (1:3) film as compared to without the layer) and the construction of an intermediate step for electron injection. Besides, the chelated K⁺ forms electron-transporting channel. The electrons which directly inject to chelated K⁺ or originally inject to the backbone of PCn6 and then spontaneously hop to chelated K⁺ (because the lowest unoccupied orbital (LUMO) level of PCn6 is closer to vacuum level than the energy level of chelated K⁺) can migrate through these channels to the interface of EIL/EML. Then, the electrons can easily hop to EML because the chelated K⁺ is in pseudo-metallic state of potassium metal. In short, the existence of chelated K⁺ can facilitate electron injection from Al cathode (work function is 4.28 eV) (Chen, S. A., et al., Adv. Polym. Sci., 212, 49 (2008)) to EML (its LUMO level is 2.86 eV) (Lu, H. H., et al., Adv. Mater., 19, 2574 (2007)). In addition, PEO provides HB functionality to increase hole-electron recombination fraction in EML and, therefore, enhance device performance. [Energy levels of PEDOT and β-PFO are referred to our previous work (Lu, H. H., et al., Adv. Mater., 19, 2574 (2007)). Energy level of PCn6 is the same as that of β-PFO because their main chain structures are the same and the Cn6 capped alkyl side-chain should not affect much the electronic state of main chain.]

The present invention can be better understood through the following examples which are merely for illustrative, not for limiting the scope of the present invention.

Example 1
Preparation of Poly[9,9'-bis(6'-(((1,4,7,10,13,16)-hexaoxacyclooctadecanyl)methoxy)hexyl)fluorene] (PCn6)
The synthetic routes for the monomer and polymer are shown in Schemes 1-4, respectively.
Scheme 1
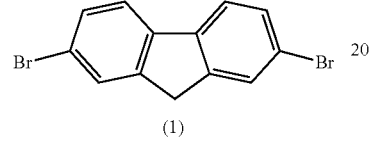
Scheme 2
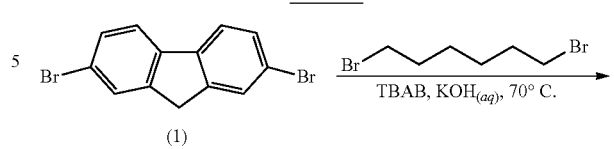
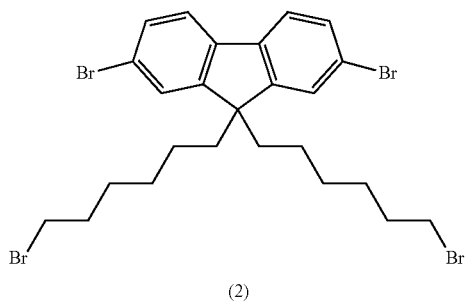
Scheme 3
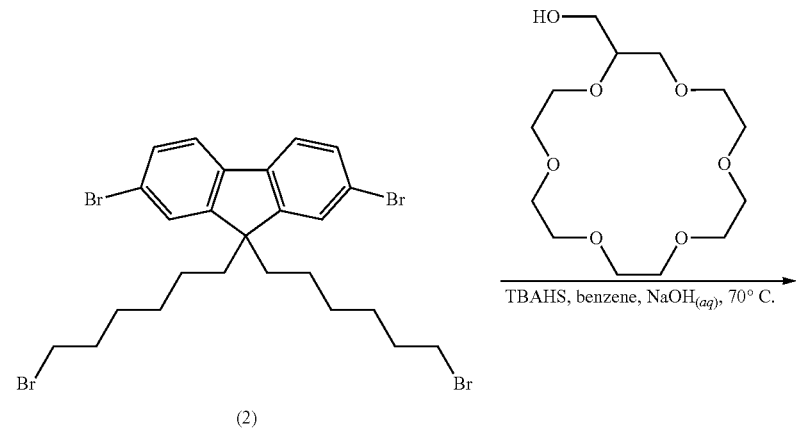
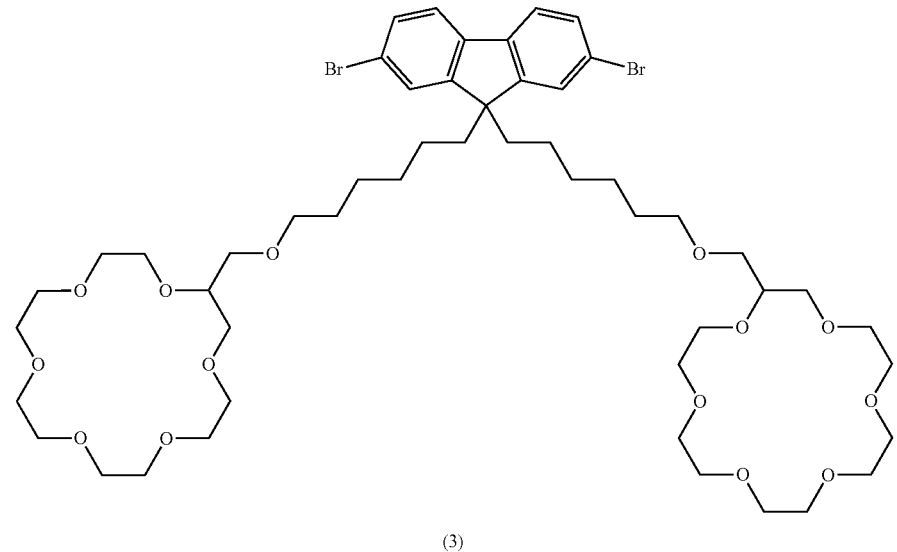

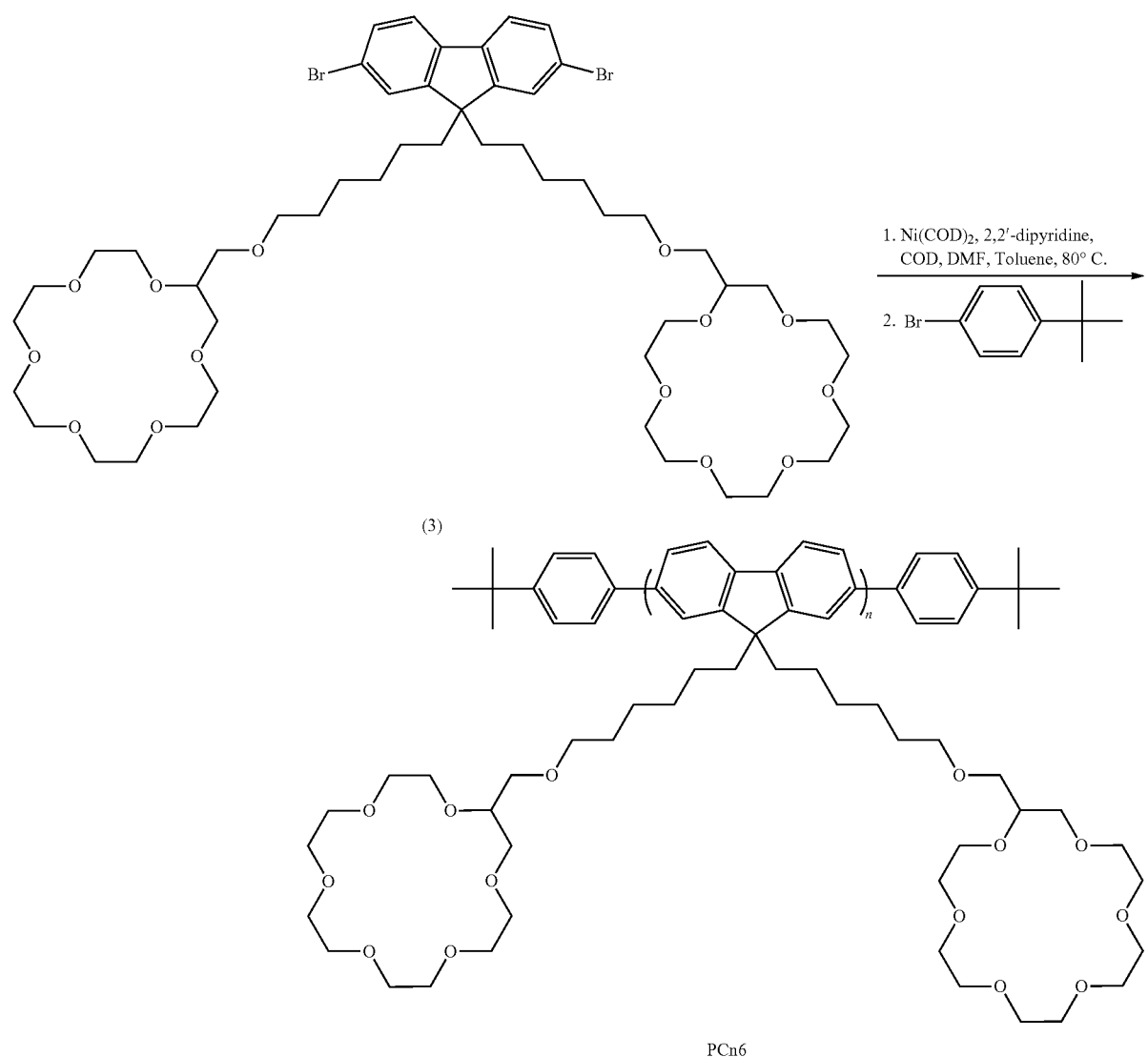

1. 2,7-dibromofluorene (1)

To a mixture of fluorene (22.75 g, 0.136 mol), iodine (0.392 g, 0.0154 mol), and CH$_2$Cl$_2$ (150 mL), bromine (15.8 mL, 0.288 mol) diluted with CH$_2$Cl$_2$ (20 mL) were added dropwisely at 0° C. over a period of 1 h. After 12 h, a solution of sodium bisulfite (3.0 g) in water (20 mL) was added and the mixture was stirred for 30 min to become colorless. The organic phase was separated and washed by water (150 mL). The organic phase was dried over anhydrous MgSO$_4$ and CH$_2$Cl$_2$ was distilled off. The product slurry was filtered and the product was dried under vacuum to give a white solid (41.8 g, yield 94.9%, m.p. 156-160° C.). $^1$H NMR (500 MHz, CDCl$_3$). δ (ppm): 7.62 (s, 2H), 7.58 (d, 2H), 7.48 (d, 2H), 3.83 (d, 2H).

2. 2,7-dibromo-9,9-bis(6'-bromohexyl)fluorene (2)

A mixture of 1 (5.0 g, 15.43 mmol), 1,6-dibromohexane (30 mL), tetrabutylammonium bromide (TBAB) (0.5 g), and potassium hydroxide aqueous solution (30 mL, 50% w/w) was stirred at 70° C. for 24 h under nitrogen. After diluting the reaction mixture with dichloromethane, the organic layer was washed with water and brine. The separated organic layer was dried over magnesium sulfate, and dichloromethane was evaporated. The residual 1,6-dibromohexane was distilled in a vacuum, and compound 2 (5.67 g, 56.5%) was obtained as a white crystal by chromatography with hexane/CH$_2$Cl$_2$ (95:5) as the eluent; m.p. 68° C. $^1$H NMR (500 MHz, CDCl$_3$). δ (ppm): 7.51 (d, 2H, J=8.0 Hz), 7.45 (d, 2H, J=8.0 Hz), 7.42 (s, 2H), 3.27 (t, 4H, J=7 Hz), 1.91 (t, 4H, J=8.5 Hz), 1.65 (p, 4H, J=8 Hz), 1.18 (p, 4H, J=8 Hz), 1.06 (p, 4H, J=7.5 Hz), 0.57 (m, 4H).

3. 2,7-dibromo-9,9'-bis(6'-(((1,4,7,10,13,16)hexaoxacyclooctadecanyl)-methoxy)hexyl)fluorene (3)

Under inert gas atmosphere, 2-hydroxymethyl-18-crown-6 (1.8 mmol, 0.530 g) was slowly dropped into an emulsion of 2 (0.9 mmol, 0.585 g), tetra-n-butylammonium hydrogen sulfate (TBAHS) (21.6 mg, 0.063 mmol), benzene (5 mL), and sodium hydroxide aqueous solution (1.5 mL, 50% w/w). The mixture was heated to 70° C. and rigorously stirred for 24 h. After the completion of the reaction, the reaction mixture was poured into water and extracted with ether. The combined organic phases were washed with water followed by dried over magnesium sulfate, and compound 3 (0.442 g, 41%) was obtained as colorless oil after purification with chromatography ($Al_2O_3$-packed column, ethyl acetate as the eluent). $^1H$ NMR (500 MHz, $CD_2Cl_2$). δ (ppm): 7.55 (s, 1H), 7.53 (s, 1H), 7.44-7.46 (m, 4H), 3.44-3.68 (m, 46H), 3.25-3.36 (m, 8H), 1.91-1.94 (m, 4H), 1.32-1.34 (m, 4H), 1.05-1.07 (m, 8H), 0.54-0.57 (m, 4H). $^{13}C$ NMR (125 MHz, $CD_2Cl_2$). δ (ppm): 152.90, 139.52, 130.46, 126.58, 121.76, 121.56 (C-fluorene ring), 78.45, 71.78, 71.65, 71.00, 70.90, 70.84, 70.79, 70.72, 69.76 (—$OCH_2$—), 56.05 ($C_9$-fluorene ring), 40.43 (—$CH_2$—), 30.03 (—$CH_2$—), 29.89 (—$CH_2$—), 26.11 (—$CH_2$—), 24.03 (—$CH_2$—).

4. Poly[9,9'-bis(6'-(((1,4,7,10,13,16)hexaoxacyclooctadecanyl)methoxy) -hexyl)fluorene] (PCn6)

A solution of $Ni(COD)_2$ (0.85 g, 3.0 mmol), 2,2'-dipyridine (0.35 g, 2.2 mmol), cyclooctadiene (0.25 g, 2.2 mmol), and N,N-dimethyformamide (DMF) (5 mL) was heated to 80° C. for 30 min. Then a solution of 3 (0.538 g, 0.5 mmol) in 5 mL of toluene was added, and the reaction mixture was stirred at 80° C. for 4 days. The polymerization proceeded for additional 12 h after adding 4-tert-butyl-1-bromobenzene (8.67 μL, 0.05 mmol) as end-capping agent. After cooling to room temperature, the reaction mixture was poured onto chloroform and washed consecutively with aqueous solution of HCl (6 mol/L), distilled water, and brine. The separated organic layer was dried over magnesium sulfate, and the solvent was evaporated. The resulting polymer was precipitated from hexane. After that, the polymer was dissolved in $CHCl_3$ and then precipitated in hexane to remove oligomers. Finally, the fractioned polymer was dried under vacuum for 24 h to obtain a yellow fiber (0.288 g, 62.8%). $^1H$ NMR (500 MHz, $CD_2Cl_2$). δ (ppm): 7.83 (b, 2H), 7.66 (b, 4H), 3.31-3.75 (b, 54H), 0.82-2.15 (b, 20H).

The synthetic procedures for PCn6 end-capped with para-tert-butyl phenyl used here are according to that reported in our published work (Hung, M. C., et al., J. Am. Chem. Soc., 127, 14576 (2005)). Molecular weight ($M_w$) and polydispersity index of PCn6 are 158,000 Daltons and 1.3, respectively, determined by gel permeation chromatography using polystyrenes as standards.

Example 2

Chelation of Cn6 to $K^+$

For forming PCn6/$K^+$ complex, a solution (based on 1 mg/mL PCn6 in mixed solvent of D. I. water/methanol=1:19 vol. ratio) with a Cn6:$K^+$ mole ratio of 1:1 (or 1:3) was heated at 65° C. for 3 h.

Example 3

Device Fabrication and Characterization of Opto-Electronic Properties of Devices 1. Device Fabrication For β-PFO-based devices with Al or Au as the cathode, an indium tin oxide (ITO) glass substrate was exposed to oxygen plasma at a power of 50 W and a pressure of 193 mTorr for 5 min. A thin hole-injection layer (25 nm) of poly(styrene sulfonic acid)-doped poly(3,4-ethylenedioxythiophene) (PEDOT) (Baytron P VP.AI 4083 from Bayer, with a conductivity of $2 \times 10^{-4}$-$2 \times 10^{-3}$ S/cm) was spin-coated on the treated ITO substrate. After baking at 140° C. for 1 h in an oven installed inside a glove-box with argon, a thin layer (120 nm) of PFO was spin-coated on top of the treated ITO substrate from its solution (7 mg/mL in tetrahydrofuran). The PFO film was treated to form β phase by spin-coating ethyl acetate atop it with a rotation speed of 1500 rpm for 30 s. For the case of inserting a Cn6:$K^+$ (1:x) layer (20 nm), a solution (based on 1 mg/mL PCn6 in mixed solvent of D. I. water/methanol=1:19 vol. ratio) with a Cn6:$K^+$-ion mole ratio of 1:1 (or 1:2, 1:3) was spin-coated on top of β-PFO film. $K_2CO_3$ (Showa Chemical) was used without further purification. For the case of inserting a PCn6:PEO(1:y) layer (20 nm), a PCn6:PEO(1:y) solution (based on 0.5 mg/mL PCn6 in mixed solvent of D. I. water/methanol=1:19 vol. ratio) with a Cn6:$K^+$ mole ratio of 1:3 and a PCn6:PEO wt. ratio of 1:0.75 (or 1:1, 1:1.5, 1:2) was spin-coated on top of β-PFO film. PEO (its weight-average molecular weight is 600000 Da) was purchased from Aldrich and used without further purification. For the case of inserting a Cn5:$K^+$ (1:3) layer (20 nm), a solution (based on a concentration of PCn5 in solution of 1 mg/mL in D. I. water/methanol=1:19 vol. ratio) with a Cn5:$K^+$-ion mole ratio of 1:3 was spin-coated on top of β-PFO film (100 nm). Finally, a thin layer of Al or Au (60 nm) was deposited in a vacuum thermal evaporator below $10^{-6}$ Torr through a shadow mask. The active area of the diode was about 8-10 $mm^2$. For PFO:F8BT-based device, all the procedures were the same as those described above except that the EML was spin-coated from PFO:F8BT solution (1:0.05 wt. ratio, 6.3 mg/mL in tetrahydrofuran). For MEHPPV-based device, all the procedures were the same as those described above except that the EML was spin-coated from MEHPPV solution (6 mg/mL in toluene) and PEDOT was changed to Baytron P CH 8000 (from Bayer, its conductivity is $10^{-5}$ S/cm). The thickness of the polymer film was measured by using a surface profiler (Tencor P-10).

2. Characterization of Opto-Electronic Properties of Devices
(1) Voltage-Current-Brightness Curves The electric characteristics and luminance of the device were measured by using a Keithley power supply (Model 238) and a luminance meter (BM8 from TOPCON), respectively.

(2) EL Spectroscopic Measurements

EL spectra were measured by using a fluorescence spectrometer (FluoroMAX-3 from Jobin Yvon). All the measurements of the EL spectra were undertaken in a vacuum environment.

(3) Photovoltaic Measurements

Photovoltaic measurements were performed using a Keithley 2400 SourceMeter under the illumination of a white light of 100 mW/$cm^2$ onto β-PFO-based devices (from ITO glass side) from a stimulated AM1.5 light source (Oriel Co.). Open-circuit voltages were derived from the zero-photocurrent points on curves of photocurrent density versus voltage (Wu, H. B., et al., Adv. Mater., 129, 1826 (2004). Yu, L. S., et al., Adv. Mater. 16, 744 (2004)).

(4) X-Ray Photoemission Spectroscopy (XPS) Measurements.

For XPS measurements, Cn6:$K^+$ (1:1 and 1:3) and Cn5:$K^+$ (1:3) films were obtained by spin-coating from their solutions (the same as those described above for device fabrication) on top of ITO glasses. For PEO:$K^+$ (6:3) film, a solution (based on a PEO concentration of 0.58 mg/mL in D. I. water/methanol=1:19 vol. ratio) with a PEO (repeat unit):$K^+$-ion mole ratio of 6:3 was spin-coated on top of ITO glass. The $K_2CO_3$ film was formed by drop-casting on ITO glass from it solution (2 mg/mL in mixed solvent of D. I. water/methanol=1:19 vol. ratio). XPS spectra were obtained with a photoelectron spectroscopy system (VG, MULTILAB 2000) under a base pressure of $1 \times 10^{-9}$ mbar by using monochromatized Mg ($K_\alpha$) X-rays (hv=1254.6 eV).

Example 4

Evidence for the Reduction of Electron-Injection Barrier by the Incorporation of PCn6:$K^+$ (1:x) Layers Between EML and Al Cathode To find out why the device current density (i.e., electron current density) could be increased as PCn6:$K^+$ (1:x) layers were used, we performed photovoltaic measurements to investigate whether the addition of these layers could enhance electron injection. As shown in FIG. 7, the $V_{oc}$ taking as the transition point of photocurrent density-voltage plot (Wu, H. B., et al., Adv. Mater., 16, 1826 (2004). Yu, L. S., et al., Adv. Mater., 16, 744 (2004)) increases from 1.24 V (without these layers) to 2.07, 2.25, and 2.36 V for inserting with PCn6:$K^+$ (1:x) layers (x=0, 1 and 3), respectively. Since $V_{oc}$ reflects the built-in potential across the junctions and the anodes are the same for the four devices, the increase in $V_{oc}$ indicates a decrease in electron-injection barrier (Wu, H. B., et al., Adv. Mater., 16, 1826 (2004). Yu, L. S., et al., Adv. Mater., 16, 744 (2004)). Therefore, the larger current density for the devices with Cn6:$K^+$ (1:x) layers as compared to that without the layers (FIG. 2(b)) is attributed to the reduction of electron-injection barrier. And $V_{oc}$ increasing with larger $K_2CO_3$ content in PCn6 accounts for the observed larger current density for the device with larger $K_2CO_3$ content in PCn6. The barrier reduction is resulted from the raise of vacuum level of the cathode relative to that of EML due to a formation of an interfacial dipole (Wu, H. B., et al., Adv. Mater., 16, 1826 (2004). Yu, L. S., et al., Adv. Mater., 16, 744 (2004). Yu, J. M., et al., J. Polym. Sci. Part A: Polym. Chem., 47, 2985 (2009). Huang, F., et al., Adv. Mater., 19, 2010 (2007)).

Example 5

Deconvolution of XPS Spectra of PCn6:$K^+$ (1:1) and PCn6:$K^+$ (1:3) Films to Determine the Fractions of Cn6 Chelating to $K^+$ From XPS spectra of PCn6:$K^+$ (1:1) and PCn6:$K^+$ (1:3) films (FIGS. 3(b) and 3(c)), the fractions of Cn6 chelating to $K^+$ in these two films can be determined by deconvoluting their K 2p signal peaks. After the deconvolution, we obtain the three peaks (peaks 1, 2, and 3) located at 293.29, 293.94, and 296.45 eV, respectively (FIGS. 3(b) and 3(c)). The first and second peaks should represent K $2p_{3/2}$ binding energies of the chelated $K^+$ and non-chelated $K^+$ in the two films, respectively, because their peak positions lie in between those of potassium metal (292.60 eV) and $K_2CO_3$ (294.11 eV) (i.e., non-chelated $K^+$), respectively. And the third peak represents K $2p_{1/2}$ binding energy. From the deconvoluted K $2p_{3/2}$ peaks (peaks 1 and 2), their area ratio (taking as mole ratio) of chelated $K^+$/non-chelated $K^+$ can be calculated to be 1:1.53 and 1:2.17 for PCn6:$K^+$ (1:1 and 1:3) films, respectively. Based on the blending mole ratio of Cn6:$K^+$ (i.e., 1:1 and 1:3) and mole ratio of Cn6/$K^+$ complex being 1:1 (Pedersen, C. J., Angew. Chem. Int. Ed. Engl., 27, 1021 (1988)), the theoretical ratios of chelated $K^+$/non-chelated $K^+$ based on that Cn6 totally chelates to $K^+$ are 1:0 and 1:2 for Cn6:$K^+$ (1:1 and 1:3) films, respectively. Therefore, we can obtain the actual chelating fractions of Cn6 to be 39.5% and 94.7% for PCn6:$K^+$ (1:1) and PCn6:$K^+$ (1:3) films, respectively. In other words, Cn6 moiety can chelate to $K^+$ almost close to 100% as Cn6:$K^+$ is increased to 1:3.

Example 5

Evidence for PEO Serving as Hole-Blocking Function in PCn6:PEO(1:y) Layers

As shown in FIG. 7, blending PEO into PCn6:$K^+$ (1:3) film with a PCn6:PEO weight ratio of 1:1 does not change its $V_{oc}$ value (also 2.36 V), indicating that PEO does not affect the reduction of electron-injection barrier caused by PCn6:$K^+$ (1:3) film. Therefore, the decrease of current density of PCn6:PEO(1:1)/Al as compared to that of PCn6:$K^+$ (1:3)/Al (FIG. 2b) is resulted from the hole-blocking function provided by PEO.

Example 6

EL Spectra of PCn6:PEO(1:0.75)/Al

FIG. 8 shows the emission from the PCn6:PEO (1:0.75)/Al and the EL spectrum exhibits three characteristic β-phase emission peaks located at 440, 467, and 498 nm (Lu, H. H., et al., Adv. Mater., 19, 2574 (2007)). The emission is deep blue with the CIE coordinates (0.160, 0.113).

Example 7

Performance of Device with the Other High Work Function Metal, Gold

We used Au (its work function 5.1 eV is higher than that of Al (4.28 eV)) (Chen, S. A., et al., Adv. Polym. Sci., 212, 49 (2008)) instead of using Al as the cathode to fabricate β-PFO-based devices with Cn6:$K^+$ (1:0 and 1:3) or PCn6:PEO(1:1) layers. As shown in Table 2, the $B_{max}$ (and $\eta_L$) can be enhanced from 1.3 cd/m² (0.0019 cd/A) for the device without the layers to 13 cd/m² (0.0066 cd/A), 51 cd/m² (0.04 cd/A), and 154 cd/m² (0.085 cd/A) for Cn6:$K^+$ (1:0)/Au, Cn6:$K^+$ (1:3)/Au, and PCn6:PEO(1:1)/Au, respectively. In other words, these layers can also work for the case of using Au as the cathode. In addition, the increasing trend of device performance with Au as the cathode is the same as that with Al as the cathode, indicating that the proposed working mechanism is correct. However, device performance with Au as the cathode is lower than that with Al as the cathode by a factor of 30-70. This is attributed to that the electron injection barrier is larger for the case with Au as the cathode because its work function is higher than that of Al by 0.82 eV.

TABLE 2

Performance characteristics of β-PFO-based devices without/with EI-HB layers. The device structure is ITO/PEDOT (25 nm)/β-PFO (120 nm)/[without/with EI-HB layers (20 nm)]/Au (60 nm).

|  | Turn-on voltage[a] (V) | Max. brightness (cd/m²) | Max. luminous efficiency (cd/A) |
|---|---|---|---|
| Without EI-HB layers | 13.4 | 1.3 | 0.0019 |
| PCn6:$K^+$(1:0) | 11.8 | 13 | 0.0066 |
| PCn6:$K^+$(1:3) | 7.7 | 51 | 0.04 |
| PCn6:PEO(1:1) | 9.2 | 154 | 0.085 |

TABLE 2-continued

Performance characteristics of β-PFO-based devices without/with EI-HB layers. The device structure is ITO/PEDOT (25 nm)/β-PFO (120 nm)/[without/with EI-HB layers (20 nm)]/Au (60 nm).

| | Turn-on voltage[a] (V) | Max. brightness (cd/m$^2$) | Max. luminous efficiency (cd/A) |
|---|---|---|---|

[a]Brightness at 0.2 cd/m$^2$.

Example 9

Performance of Device with Green- and Orange-Emission EMLs Based on Al as the Cathode Green- and orange-emission PLEDs (with Al as the cathode) with/without EI-HB layer were fabricated. As shown in Table 3, turn-on voltage of PFO:F8BT (1:0.05 wt. ratio)-based device (green emission) drops dramatically from 14 V (without PCn6:PEO(1:1) layer) to 4 V (with the layer). In addition, $B_{max}$ and $\eta_L$ can be enhanced from 100 cd/m$^2$ and 0.05 cd/A (without PCn6:PEO(1:1) layer) to 23,300 cd/m$^2$ and 12.2 cd/A (with the layer). On the other hand, turn-on voltage of MEH-PPV-based device (orange-emission) drops dramatically from 5.2 V (without PCn6:PEO(1:0.75) layer) to 2.2 V (with the layer). In addition, $B_{max}$ and $\eta_L$ can be enhanced from 30 cd/m$^2$ and 0.013 cd/A (without PCn6:PEO (1:0.75) layer) to 19,400 cd/m$^2$ and 1.87 cd/A (with the layer). Obviously, even for blending system (PFO:F8BT) or MEH-PPV (its main-chain structure different to PFO) as emitting layer, device performance can be enhanced by a factor larger than 100 when EI-HB layer is inserted between emitting layer and Al cathode. This result again demonstrates that the proposed mechanism of EI-HB layer enhancing PLED performance is correct.

TABLE 3

Performance characteristics of PFO:F8BT(1:0.05 wt. ratio)- and MEH-PPV-based devices without/with EI-HB layers. The device structures are ITO/PEDOT (25 nm)/PFO:F8BT (1:0.05 wt. ratio) (120 nm)/[without/with PCn6:PEO(1:1) layer (20 nm)]/Al (60 nm) and ITO/PEDOT (25 nm)/MEH-PPV (120 nm)/[without/with PCn6:PEO(1:0.75) layer (20 nm)]/Al (60 nm)

| | Turn-on voltage[a] (V) | Max. brightness (cd/m$^2$) | Max. luminous efficiency (cd/A) |
|---|---|---|---|
| PFO:F8BT/without PCn6:PEO(1:1) | 14 | 100 | 0.05 |
| PFO:F8BT/with PCn6:PEO(1:1) | 4 | 23,300 | 12.2 |
| MEH-PPV/without PCn6:PEO(1:0.75) | 5.2 | 30 | 0.013 |
| MEH-PPV/with PCn6:PEO(1:0.75) | 2.2 | 19,400 | 1.87 |

[a]Brightness over 2 cd/m$^2$.

Example 10

Performance Enhancement of Polymer Solar Cell by Inserting Electron Transport Layer Between Active Layer and Cathode (Al or Ca/Al)

From the photovoltaic curves shown in FIG. 7, we can calculate the solar cell parameters of these devices. For the device with Al and active layer composed of poly(3-hexylthiophene) (P3HT) as electron donor and indene-C$_{60}$ bisadduct (ICBA) as electron acceptor as shown in Table 4, that with the EI-HB layer relative to that without gives the remarkably increased performance as the PCE is promoted from 3.87% to 6.35% (PFCn6), and 6.88% (PFCn6:K$^+$). Furthermore, an insertion of a thin film of Ca was made to give the device ITO/PEDOT:PSS/P3HT:ICBA/EI-HB or without/Ca/Al. As shown in Table 4, the incorporation of PFCn6 gives an increase in PCE from 5.78% to 6.77%, and after intercalation with K$^+$ into the crown ether as PFCn6:K$^+$ gives an increase in PCE from 6.77% to 7.5%.

Chemical Structures:

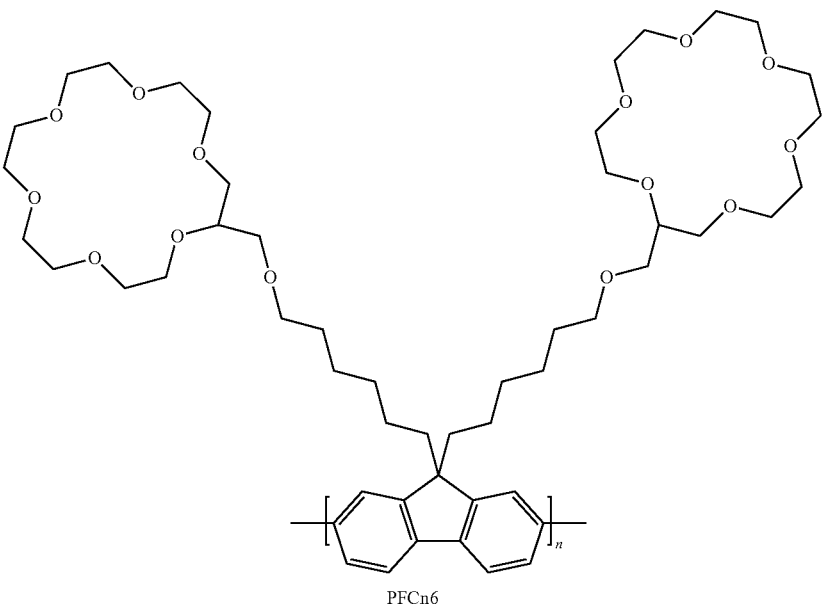

PFCn6

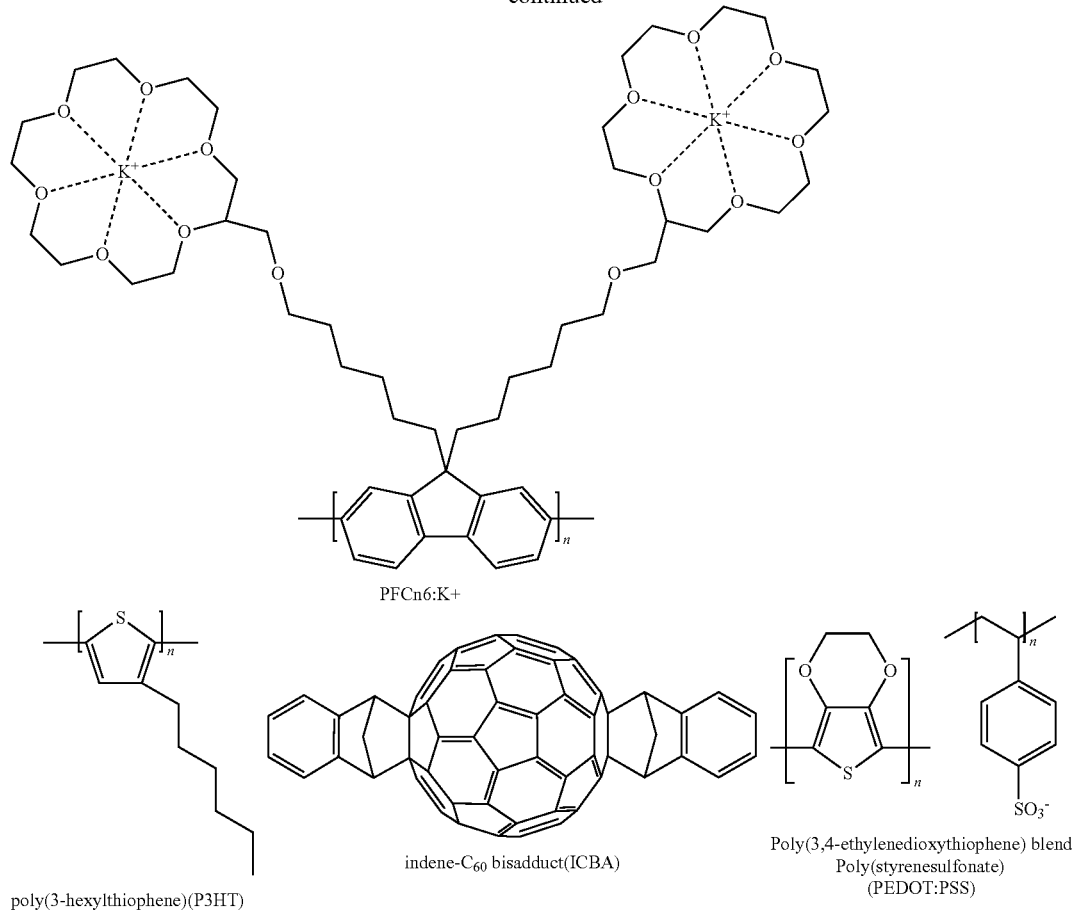

PFCn6:K+ poly(3-hexylthiophene)(P3HT)

indene-C$_{60}$ bisadduct(ICBA)

Poly(3,4-ethylenedioxythiophene) blend Poly(styrenesulfonate) (PEDOT:PSS)

TABLE 4

Photovoltaic performance of PSCs based on P3HT with the device structure ITO/PEDOT:PSS/P3HT:ICBA/EI-HB or without/Al or Ca/Al.

| Acceptor-cathode | Electron transport layer | Voc (V) | Jsc (mA/cm$^2$) | FF[a] (%) | PCE (%) |
|---|---|---|---|---|---|
| ICBA-Al | Without EI-HB | 0.71 | 8.74 | 62.4 | 3.87 |
| ICBA-Al | PFCn6 | 0.87 | 10.53 | 69.4 | 6.35 |
| ICBA-Al | PFCn6:K+ | 0.89 | 10.96 | 70.6 | 6.88 |
| ICBA-Ca/Al | Without EI-HB | 0.85 | 10.43 | 65.2 | 5.78 |
| ICBA-Ca/Al | PFCn6 | 0.87 | 10.93 | 71.2 | 6.77 |
| ICBA-Ca/Al | PFCn6:K+ | 0.89 | 11.65 | 72.6 | 7.50 |

[a]FF is the abbreviation of fill factor.

Although the present invention has been described with reference to specific details of certain embodiments thereof, it is not intended that such details should be regarded as limitations upon the scope of the invention except as and to the extent that they are included in the accompanying claims. Many modifications and variations are possible in light of the above disclosure.

The invention claimed is:

1. A composite material comprising a hole-blocking polymer and a conjugated polymer, wherein:
said conjugated polymer comprises at least a first repeating unit;
said first repeating unit is grafted with a side chain;
said side chain comprises a crown ether;
at least a portion of said crown ether is intercalated with metal ions; and
said crown ether has the following structure:

wherein q=2–7.

2. The composite material of claim 1, wherein said conjugated polymer has the following structure (I):

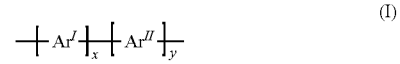

(I)

wherein x and y are molar ratios, 0≤x≤1, 0≤y≤1, and x+y=1; Ar$^I$ and Ar$^{II}$ independently are a repeating unit selected from the group consisting of mono-, bicycle- and polycyclic aromatic groups; heterocyclic aromatic group; substituted aromatic group; and substituted heterocyclic group, wherein one of the Ar$^I$ and Ar$^{II}$ is said first repeating unit. mono-, bicycle- and polycyclic aromatic groups; heterocyclic aromatic group; substituted aromatic group; and substituted heterocyclic group.

3. The composite material of claim 1, wherein said first repeating unit has a structure selected from the following group (II):

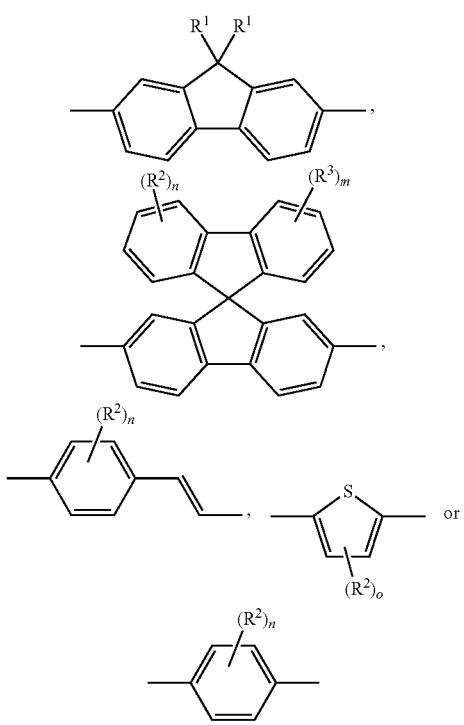

(II)

wherein m=0-4;
n=1-4;
o=1-2; and
R$^1$, R$^2$ and R$^3$ independently are crown ether-methylene-oxy-C$_1$-C$_{22}$ alkylene, crown ether-methylene-oxy-C$_1$-C$_{22}$ alkoxylene, crown ether-methylene-oxy-phenylene, crown ether-methylene-oxy-C$_7$-C$_{28}$ alkylene phenylene, crown ether-methylene-oxy-C$_7$-C$_{28}$ alkoxylene phenylene, crown ether-methylene-oxy-phenoxylene, crown ether-methylene-oxy-C$_7$-C$_{28}$ alkylene phenoxylene, crown ether-methylene-oxy-C$_7$-C$_{28}$ alkoxylene phenoxylene, crown ether-methylene-oxy-biphenylene, crown ether-methylene-oxy-C$_{13}$-C$_{34}$ alkylene biphenylene, crown ether-methylene-oxy-C$_{13}$-C$_{34}$ alkoxylene biphenylene, crown ether-methylene-oxy -biphenylene-oxy, crown ether-methylene-oxy-C$_{13}$-C$_{34}$ alkylene biphenylene-oxy, or crown ether-methylene-oxy-C$_{13}$-C$_{34}$ alkoxylene biphenylene-oxy.

4. The composite material of claim 3, wherein said conjugated polymer is a random copolymer, block copolymer or alternating copolymer.

5. The composite material of claim 3, wherein said conjugated polymer is a homopolymer.

6. The composite material of claim 4, wherein said conjugated polymer is a copolymer having the repeating units selected from the group (II).

7. The composite material of claim 5, wherein said conjugated polymer is a homopolymer having one of the repeating units selected from the group (II).

8. The composite material of claim 7, wherein said conjugated polymer is polyfluorene having the first repeating unit in the group (II).

9. The composite material of claim 1, wherein said conjugated polymer comprises 1~100 mol % of said first repeating unit.

10. The composite material of claim 1, wherein said metal ions are ions of an alkali metal, alkaline earth metal or transition metal.

11. The composite material of claim 1, wherein said metal ions are alkali metal ions.

12. The composite material of claim 1, wherein 1-100 mol % said crown ethers are intercalated with metal ions.

13. The composite material of claim 1, wherein said hole-blocking polymer is a conjugated or non-conjugated polymer having a (large band gap.

14. The composite material of claim 13, wherein said hole-blocking polymer is polyethyleneoxide.

15. The composite material of claim 14, wherein said polyethyleneoxide has a weight averaged molecular weight of 50,000 to 1,000,000 Daltons.

16. The composite material of claim 1, wherein said composite material is soluble in water, alcohol or a mixture thereof.

17. An organic light emitting diode, which comprises a positive electrode formed on a substrate; a negative electrode; and a light emitting layer disposed between said positive electrode and said negative electrode, wherein said organic light emitting diode further comprises a composite material as defined in claim 1 between said light emitting layer and said negative electrode.

18. The organic light emitting diode of claim 17, wherein said negative electrode is aluminum, copper, silver or gold.

19. The organic light emitting diode of claim 17 further comprising a hole injection layer formed between said positive electrode and said light emitting layer.

20. The organic light emitting diode of claim 17 further comprising a hole transporting layer formed between said positive electrode and said light emitting layer.

21. The organic light emitting diode of claim 17, which emits red light, yellow light, green light, blue light, white light or light with broad band containing multiple color peaks.

22. An organic solar cell comprising a positive electrode formed on a substrate; an organic electronic material formed said positive electrode; and a negative electrode formed on said organic electronic material, wherein said organic solar cell further comprises a composite material as defined in claim 1 between said organic electronic material and said negative electrode.

23. The organic solar cell of claim 22, wherein the substrate is a glass substrate, said positive electrode is indium tin oxide (ITO) deposited on the glass substrate, and said negative electrode is a low work function metal.

* * * * *